(12) United States Patent
Kim et al.

(10) Patent No.: US 6,360,345 B1
(45) Date of Patent: Mar. 19, 2002

(54) DECODING METHOD OF TURBO CODES USING A WEIGHTED PARALLEL TYPE AND DEVICE FOR THE SAME

(75) Inventors: Sang Wu Kim, Taejon-si; Sung-Joon Park, Koyang-si, both of (KR)

(73) Assignee: Korea Advanced Institute of Science and Technology, Taejon-si (KR)

( * ) Notice: Subject to any disclaimer, the term of this patent is extended or adjusted under 35 U.S.C. 154(b) by 0 days.

(21) Appl. No.: 09/364,958

(22) Filed: Jul. 30, 1999

(30) Foreign Application Priority Data

Sep. 25, 1998 (KR) ........................................ 1998-39976

(51) Int. Cl.[7] .............................................. G06F 11/00
(52) U.S. Cl. ........................ 714/746; 714/755; 714/780
(58) Field of Search ................................ 714/746, 755, 714/780

(56) References Cited

U.S. PATENT DOCUMENTS

| | | |
|---|---|---|
| 5,446,747 A | 8/1995 | Berrou |
| 6,023,783 A * | 2/2000 | Divsalar et al. ............ 714/792 |
| 6,272,183 B1 * | 8/2001 | Berens et al. ............... 375/262 |

* cited by examiner

*Primary Examiner*—Phung M. Chung
(74) *Attorney, Agent, or Firm*—Bachman & LaPointe, P.C.

(57) ABSTRACT

In a turbo decoder for code rate 1/n which consists of a decoding block, that is, n−1 constituent decoders, n−2 interleavers and n−2 deinterleavers, one embodiment of a decoding method according to the present invention comprises: a first decoding process of sequentially decoding starting from a first constituent decoder among the n−1 constituent decoders to generate a first log-likelihood ratio; a second decoding process of sequentially decoding starting from a second constituent decoder to generate a second log-likelihood ratio different from the first log-likelihood ratio, the second decoding process being activated in parallel with the first decoding process; a (n−1)th decoding process of sequentially decoding starting from a (n−1)th constituent decoder to generate a (n−1)th log-likelihood ratio different from the log-likelihood ratios, the (n−1)th decoding process being activated in parallel with other decoding processes; a step of optimally weighting respective components forming each log-likelihood ratio simultaneously generated at each decoding process; and a step of combining the weighted log-likelihood ratios and performing the hard decision using a combiner to obtain diversity gain. Another embodiment of a decoding method comprises the steps of: after adding a decoding block, activating the decoding blocks in parallel; activating the constituent decoders of each decoding block in parallel; optimally weighting components of respective log-likelihood ratios from respective decoding processes and combining the weighted log-likelihood ratios at the combiner. The present invention considerably improves a bit error rate characteristic and reduces the number of iterations required to satisfy a given bit error rate, compared with the conventional decoding method.

12 Claims, 6 Drawing Sheets

DECODING METHOD OF TURBO CODES USING A WEIGHTED PARALLEL TYPE AND DEVICE FOR THE SAME

BACKGROUND OF THE INVENTION

1. Field of the Invention

The present invention relates to a decoding method of turbo codes used in a digital communication system and more particularly to a decoding method of turbo codes and a device for the same, for activating related decoders in parallel, optimally weighting on the components of log-likelihood ratio generated from respective constituent decoders, and combining weighted log-likelihood ratios to obtain diversity gain, thereby reducing a bit error rate and decreasing the number of iterations.

2. Description of Related Art

Generally, as a channel error occurring in a digital communication system, there are noise and fading which is a phenomenon of signal distortion caused by random characteristics of transmission materials. To cope with this error factor and increase reliability, an error correction method is provided.

A representative commercialized method among the error correction methods used for digital communication systems is a method using a convolutional encoder and a Viterbi decoder. As users' demand for multimedia information, such as video and data, increases recently, an error correction method accomplishing a much better bit error rate is required. Among various techniques for enhancing error correction capability, a turbo code has been provided as a novel technique and now is in the center of attention.

According to the turbo code system, data sequence and interleaved data sequence are respectively encoded for transmission, and reliability obtained through respective constituent decoders is communicated during the decoding, thereby enhancing reliability.

With reference to the accompanying drawings, transmitter and receiver of turbo code as described above will now be reviewed. FIGS. 1a and 1b are block diagrams for respectively showing conventional turbo encoder and decoder for code rate 1/3.

As shown in FIG. 1a, the encoder comprises: interleaver 10 for scrambling the data sequence (d) according to a prescribed rule to provide outputs; first convolutional encoder 11 for convolutionally encoding the data sequence (d) to provide outputs; second convolutional encoder 12 for convolutionally encoding the interleaved sequence of the data sequence (d) to provide outputs.

In FIG. 1a, a reference character, $x_0$, is the same as the data sequence (d), $x_1$ is the sequence that the data sequence (d) has been encoded and $x_2$ is the sequence that the data sequence (d) has been interleaved and then encoded.

With reference to FIG. 1b, the structure of the receiving party corresponding to the transmitting party having such structure as described above will now be described. The sequences $y_0$, $y_1$ and $y_2$ are the decoder input sequences corresponding to the sequences $x_0$, $x_1$ and $x_2$ respectively. The decoder comprises: first constituent decoder 21 for receiving and decoding based on the sequences $y_0$, $y_1$ and the a priori information from the second constituent decoder 22 to output a log-likelihood ratio and provide extrinsic information to the second constituent decoder 22; interleaver 20 for receiving and scrambling the sequence $y_0$ and the extrinsic information from the first constituent decoder 21 according to the rule as in the interleaver 10 to provide outputs; second constituent decoder 22 for receiving and decoding based on the interleaved sequence of $y_0$, the sequence $y_2$ and the a priori information from the first constituent decoder 21 to provide outputs; and deinterleaver 23 for receiving data outputs from the second constituent decoder 22, recovering the original order of sequences to output a log-likelihood ratio and provide ethnic information to the first constituent decoder 21 as a priori information.

Before undertaking description on the operation of the conventional turbo decoder having such structure, it may be advantageous to set forth definitions of certain terms for the purpose of helping to understand the decoding of turbo code. The terms to be defined are "log-likelihood ratio" and components of the log-likelihood ratio, "extrinsic information", "a priori information", and "channel value".

The log-likelihood ratio, ($d_k$) means the log value of the ratio of the a posteriori probabilities of the $d_k$. It can be estimated that $d_k$ is "1" if the log-likelihood ratio is a positive value and $d_k$ is "0" if the log-likelihood ratio is a negative value. As the magnitude of the log-likelihood ratio gets larger, the reliability of this estimation gets higher. The following formula is the definition of $_1(d_k)$, the log-likelihood ratio of the first constituent decoder 21.

[Formula 1]

wherein, "observations" are the input sequences of the first constituent decoder 21, namely, the sequences $y_0$, $Y_1$ and the a priori information from tile second constituent decoder 22. (Similarly, $_2(d_k)$ is defined as the log-likelihood ratio of the second constituent decoder 22 where "observations" are the input sequences of the second constituent decoder 22, namely, the interleaved sequences of $y_0$, the sequence $y_2$ and the a priori information from the first constituent decoder 21.) Such log-likelihood ratio can be divided into the following three components:

[Formula 2]

wherein, the second term in the right side is the a priori information from the second constituent decoder 22, the third term is the channel value of the $d_k$ and the first term is the extrinsic information obtained from the present constituent decoding and provided to the second constituent decoder 22 as a priori information for the next constituent decoding.

Therefore, a priori information means the data transferred from the previous constituent decoding and used for obtaining the log-likelihood ratio of the present constituent decoding, and extrinsic information means the data derived from the log-likelihood ratio obtained by the present constituent decoding and used as a priori information for the next constituent decoding.

Based upon the terms defined above, the conventional decoding method will now be described. Primarily, the first constituent decoder 21 computes a log-likelihood ratio using the sequences $y_0$ and $y_1$, and provides the extrinsic information that is one of components of the computed log-likelihood ratio to the second constituent decoder 22 as a priori information. The second constituent decoder 22 computes a log-likelihood ratio using the interleaved sequence of $y_0$, the sequence $Y_2$ and the a priori information from the first constituent decoder 21, and provides the extrinsic information that is one of components of the computed log-likelihood ratio to the first constituent decoder 21 as a priori information.

According to the system described above, the sequential path of first and second constituent decodings is defined as 1 iteration. After the time when the number of iterations, p, exceeds 1, the first constituent decoder 21 uses the extrinsic information from the second constituent decoder 22 as a priori information when computing the log-likelihood ratio.

After the iterations are performed a predetermined number of times, the hard decision is made on the latest log-likelihood ratio against a threshold "0" to estimate the $d_k$. As the number of iterations increases, the bit error rate gets smaller but the degree of the improvement of the bit error rate gradually decreases. Since increasing the number of iterations results in the increase of decoding time, the number of iterations cannot be unlimitedly increased especially in real-time communication system.

According to the conventional decoding method, when a code rate is 1/n, the required number of constituent decoders is n−1 and the number of log-likelihood ratios obtained at a certain decoding time is 1.

SUMMARY OF THE INVENTION

Accordingly, the present invention is directed to a decoding method of turbo codes and a device for the same that substantially obviates one or more of the limitations and disadvantages of the related art.

An objective of the present invention is to provide a decoding method of turbo codes and a device for the same, for activating constituent decoders in parallel, optimally weighting the components of log-likelihood ratio obtained at each constituent decoder to form a weighted log-likelihood ratio, and combining the weighted log-likelihood ratios to obtain diversity gain, thereby reducing a bit error rate and decreasing the number of iterations.

Additional features and advantages of the invention will be set forth in the following description, and in part will be apparent from the description, or may be learned by practice of the invention. The objectives and other advantages of the invention will be realized and attained by the structure as illustrated in the written description and claims hereof as well as the appended drawings.

To achieve these and other advantages, and in accordance with the purpose of the present invention as embodied and broadly described, in a turbo decoder for code rate 1/n including n−1 constituent decoders, n−2 interleavers and n−2 deinterleavers, a turbo code decoding method comprises: a first decoding process starting from a first constituent decoder among the n×1 constituent decoders to generate a first log-likelihood ratio; a second decoding process being activated in parallel with the first decoding process and starting from a second constituent decoder to generate a second log-likelihood ratio different from the first log-likelihood ratio; a (n−1)th decoding process being activated in parallel with other decoding processes and starting from a (n−1)th constituent decoder to generate a (n−1)th log-likelihood ratio different from the log-likelihood ratios; a step of optimally weighting respective components forming each log-likelihood ratio generated by each constituent decoder at each decoding process; and a step of combining the weighted log-likelihood ratios and performing the hard decision to obtain diversity gain.

In another aspect, the present invention provides a device for decoding turbo codes of code rate 1/n including n−1 constituent decoders, n−2 interleavers, and n−2 deinterleavers, comprising: n−1 constituent decoders, each for receiving parts of sequences from a transmitting party and extrinsic information from a previous constituent decoding as a priori information and for providing a log-likelihood ratio and extrinsic information; n−2 interleavers respectively coupled to fronts of each constituent decoder other than a first constituent decoder, each for receiving parts of the sequence from the transmitting party and extrinsic information and scrambling them according to a particular rule to provide outputs; n−2 deinterleavers, respectively coupled to backs of each constituent decoder other than the first constituent decoder, for receiving the log-likelihood ratio and extrinsic information and recovering original order of sequences to provide outputs; and a combiner for optimally weighting the components of log-likelihood ratio generated by each decoding process and combining n−1 weighted log-likelihood ratios after a predetermined number of iterations, and providing a combined result.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

With reference to the accompanying drawings, a preferred embodiment of the present invention will now be described.

Figure 1A:
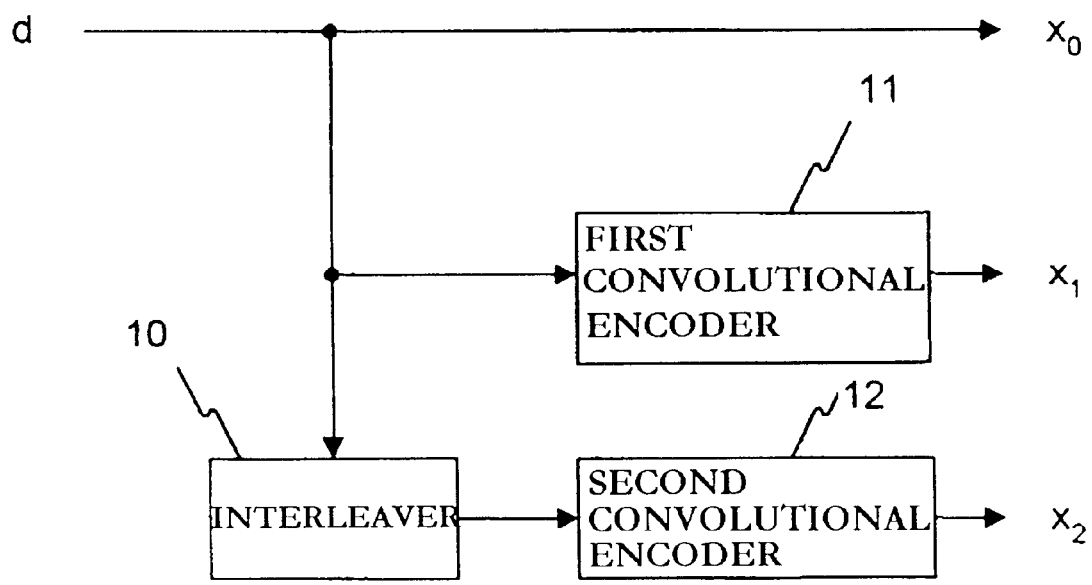
FIGS. 1a and 1b are block diagrams for respectively showing conventional turbo encoder and decoder for code rate 1/3.
Figure 1B:
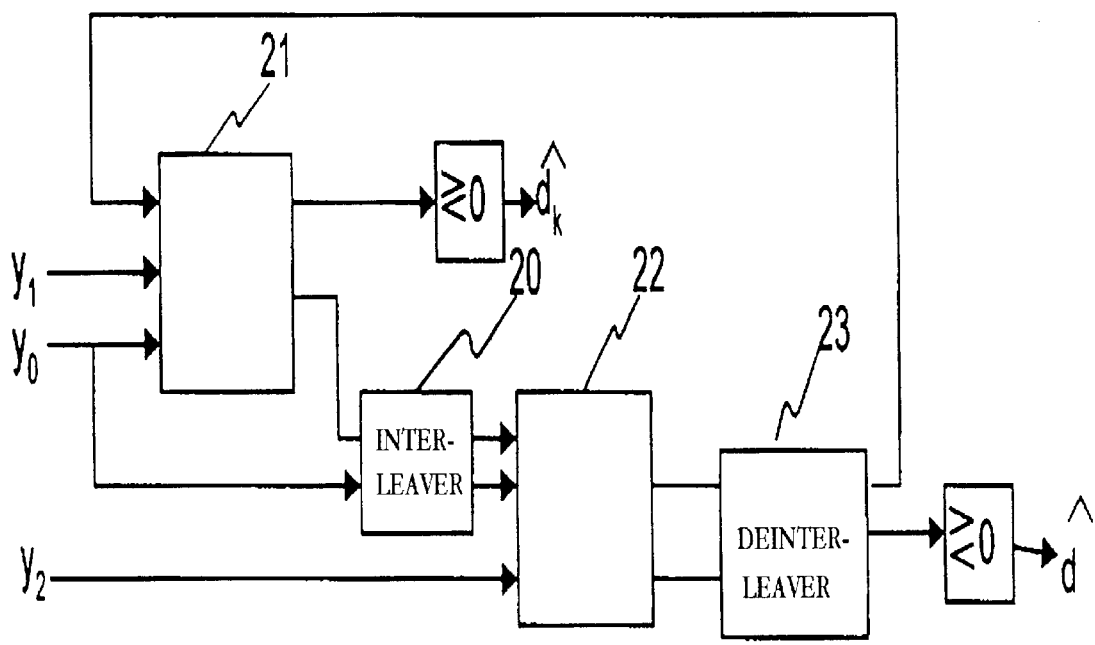
Figure 2:
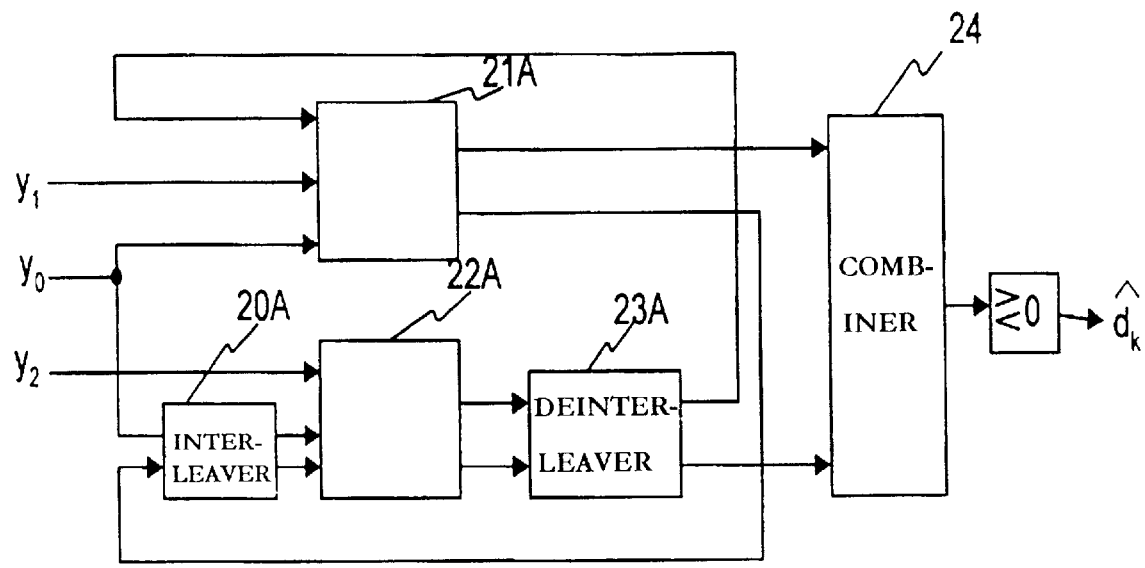
FIG. 2 is a block diagram showing a turbo decoding method A of the present invention for code rate 1/3.

FIG. 2 is a block diagram showing a code rate 1/3 decoder performing a turbo decoding method A according to the present invention. The encoder structure is the same as the conventional one illustrated in FIG. 1a.

Referring to FIG. 2, a structure of a receiving party corresponding to the transmitting party will now be reviewed. The decoder in the receiving party comprises: first constituent decoder 21A, second constituent decoder 22A, interleaver 20A, deinterleaver 23A, and combiner 24. In this decoder, a decoding process starting from the first constituent decoder 21A and a decoding process starting from the second constituent decoder 22A are activated in parallel. The two decoding processes are similar, so the description will be set forth on the basis of the first decoding process starting from the first constituent decoder 21A.

Primarily, when initially starting the first decoding process, the first constituent decoder 21A receives the sequences $y_0$ and $y_1$, and computes and provides a log-likelihood ratio to the combiner 24, and provides extrinsic information among the components of the log-likelihood ratio to the interleaver 20A. When the number of iterations exceeds 1, the first constituent decoder 21A receives the sequences $y_0$, $y_1$ and the extrinsic information that has been generated from the second constituent decoder 22A and then passed through the deinterleaver 23A as a priori information, and computes a log-likelihood ratio.

The interleaver 20A receives the sequence $y_0$ and the extrinsic information from the first constituent decoder 21A, and scrambles the order of them according to the rule as in the interleaver 10 to provide outputs to the second constituent decoder 22A.

The second constituent decoder 22A receives the interleaved sequence of $y_0$, the sequence $Y_2$ and the extrinsic information that has been generated from the first constituent decoder 21A and then passed through the interleaver 20A as a priori information. The second constituent decoder 22A then computes and provides a log-likelihood ratio and extrinsic information to the deinterleaver 23A.

The deinterleaver 23A receives data outputs from the second constituent decoder 22A and recovers the original order of sequences so as to provide extrinsic information to the first constituent decoder 21A as a priori information and a log-likelihood ratio to the combiner 24 respectively.

The second decoding process starting from the second constituent decoder 22A and performed in parallel with the first decoding process described above is similar to the first decoding process other than the operation order of the first and second constituent decodings is reversed, so the description on the second decoding process will be omitted.

After a predetermined number of iterations, the combiner 24 weighs on the components of the log-likelihood ratio generated by each decoding process and combines two weighted log-likelihood ratios to obtain diversity gain, thereby reducing the bit error rate and decreasing the number of iterations.

Operational characteristics of the turbo decoding method A according to the present invention having such configuration as described above are as follows. The encoding process by the encoder is the same as the conventional one described referring to FIG. 1a before, so the description on the encoding process will be omitted.

The sequences $y_0$ and $y_1$ are used as the inputs of the first constituent decoder 21A. The extrinsic information from the second constituent decoder 22A is supposed to be used as a priori information at the first constituent decoder 21A. When initially performing the decoding, however, there is no a priori information from the second constituent decoder 22A, so a log-likelihood ratio is computed using only the sequences $y_0$ and $y_1$, and then the extrinsic information that is a part of the computed log-likelihood ratio is provided to the second constituent decoder 22A as a priori information. When the number of iterations exceeds 1, the a priori information from the second constituent decoder 22A passed through the deinterleaver 23A is used when the first constituent decoder computes a log-likelihood ratio. At the second constituent decoder 22A, the next log-likelihood ratio is computed from the interleaved sequence of $y_0$, the sequence $Y_2$ and the a priori information from the first constituent decoder 21A passed through the interleaver 20A. The extrinsic information that is a part of the computed log-likelihood ratio is then provided to the first constituent decoder 21A as a priori information. This first decoding process starting from the first constituent decoder 21A and completing one iteration at the second constituent decoder 22A is iterated a predetermined number of iterations.

Alternatively, the interleaved sequence of $y_0$ and the sequence $Y_2$ are used as the inputs of the second constituent decoder 22A. The extrinsic information from the first constituent decoder 21A is supposed to be used as a priori information at the second constituent decoder 22A. When initially performing the decoding, however, there is no a priori information, so a log-likelihood ratio is computed using only the interleaved sequence of $y_0$ and the sequence $y_2$, and then the extrinsic information that is a part of the computed log-likelihood ratio is provided to the first constituent decoder 21A as a priori information. When the number of iterations exceeds 1, the a priori information from the first constituent decoder 21A passed through the interleaver 20A is used when the second constituent decoder computes a log-likelihood ratio. At the first constituent decoder 21A, the next log-likelihood ratio is computed from the sequences $y_0$, $Y_1$ and the a priori information from the second constituent decoder 22A passed through the deinterleaver 23A. The extrinsic information that is a part of the computed log-likelihood ratio is then provided to the second constituent decoder 22A as a priori information. This second decoding process starting from the second constituent decoder 22A and completing one iteration at the first constituent decoder 21A is iterated a predetermined number of iterations.

These two decoding processes respectively starting from the first constituent decoder 21A and the second constituent decoder 22A are simultaneously activated. Accordingly, differently from the conventional art, the decoding methods of the present invention always obtains two log-likelihood ratios at a certain decoding time and performs the hard decision based upon a value obtained by summing the two log-likelihood ratios, thereby reducing the bit error rate.

In this case of using the sum of the two log-likelihood ratios as a decision variable, this value cannot be an accurate log-likelihood ratio of the $d_k$. Therefore, the three parts making up the log-likelihood ratio are optimally weighted respectively and then combined in the combiner 24 to minimize the bit error rate.

When expressing a weight for the first term at the right side in the formula 2 as $\omega_a$ and a weight for the second term as $\omega_b$, an optimal weight pair can be defined as $(\omega_a, \omega_b)_{opt}$. $\omega_a$ is a weight for the extrinsic information obtained through the present constituent decoding and $\omega_b$ is a weight for the a priori information used for performing the present constituent decoding. When the number of iterations is small, the first term has much more information on $d_k$ than the second term, so $(\omega_a, \omega_b)_{opt}$ becomes (2, 0). As the number of iterations gets larger, the information on $d_k$ obtained from the first term and second term becomes similar, so $(\omega_a, \omega_b)_{opt}$ approximates (1, 1). This can be confirmed through simulation. In other words, an optimal weight for minimizing the bit error rate change according to the number of iterations, p.

Figure 3A:
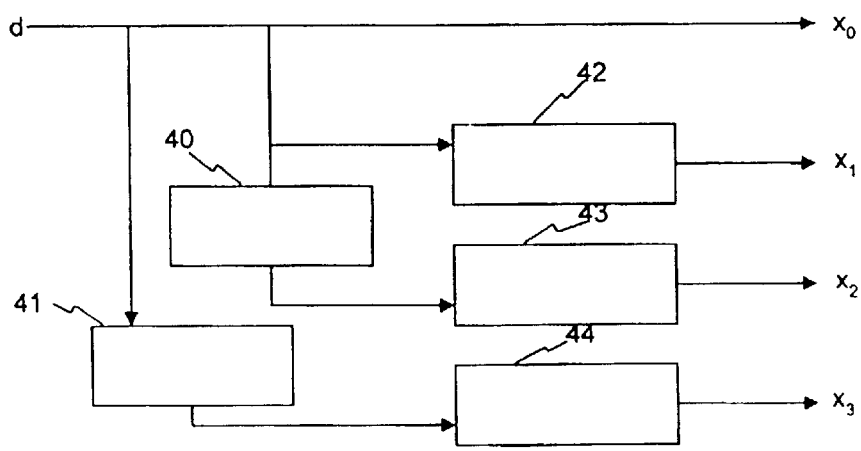
FIG. 3a is a block diagram showing a turbo encoder for code rate 1/4.
Figure 3B:
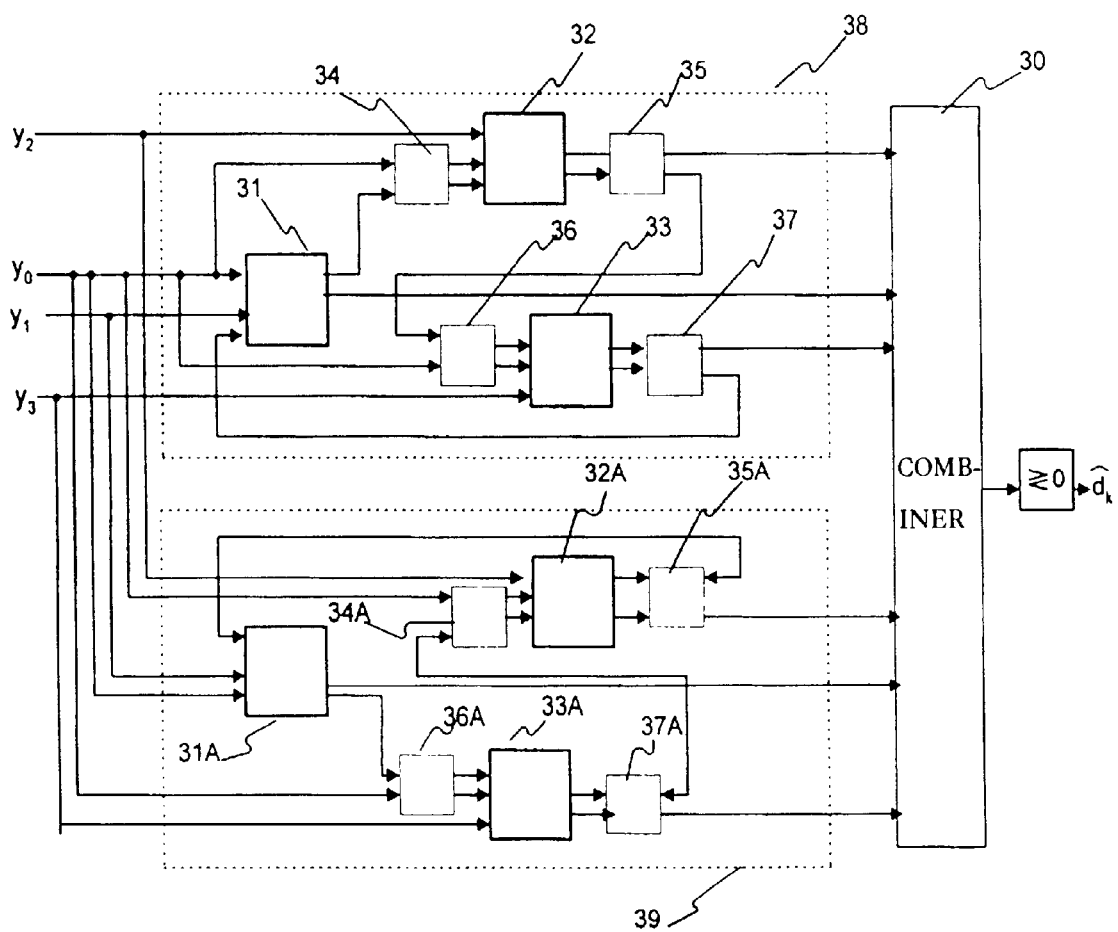
FIG. 3b is a block diagram showing a turbo decoding method B of the present invention for code rate 1/4.

Another embodiment along with the embodiment described above will now be described with reference to FIGS. 3a and 3b. FIG. 3a is a block diagram showing a code rate 1/4 turbo encoder. FIG. 3b is a block diagram showing a code rate 1/4 decoder performing a turbo decoding method B according to the present invention.

As shown in FIG. 3a, the code rate 1/4 turbo encoder comprises: first interleaver 40 for scrambling data sequence (d) according to a particular rule to provide outputs; second interleaver 41 for scrambling the data sequence (d) according to another rule different from that of the first interleaver 40 to provide outputs; first convolutional encoder 42 for convolutionally encoding the data sequence (d) to provide outputs; second convolutional encoder 43 for convolutionally encoding the interleaved sequence from the first interleaver 40 to provide outputs; and third convolutional encoder 44 for convolutionally encoding the interleaved sequence from the second interleaver 41 to provide outputs.

In FIG. 3a, a reference character, $x_0$, is the same as the data sequence (d), $x_1$ is the sequence that the data sequence (d) has been encoded, and $x_2$ and $x_3$ are the sequences that the data sequence (d) has been respectively interleaved at the first and second interleavers and then convolutionally encoded.

With reference to FIG. 3b, the structure of the receiving party corresponding to the transmitting party having such structure as described above will now be described. The sequences $y_0$, $y_1$, $y_2$ and $y_3$ are the decoder input sequences corresponding to the sequences $x_0$, $x_1$, $x_2$ and $x_3$ respectively. The decoder comprises first decoding block 38, second decoding block 39, and combiner 30. The first decoding block 38 comprises first constituent decoder 31, second constituent decoder 32, third constituent decoder 33, interleavers 34 and 36, and deinterleavers 35 and 37. The second decoding block 39 comprises fourth constituent decoder 31A, fifth constituent decoder 32A, sixth constituent decoder 33A, interleavers 34A and 36A, and deinterleavers 35A and 37A. The two decoding blocks 38 and 39 are coupled in parallel.

A decoding process starting from the first constituent decoder in the first decoding block is as follows. Primarily, when initially staring the decoding process, the first constituent decoder 31 receives the sequences $y_0$ and $y_1$, computes and provides a log-likelihood ratio to the combiner 30, and provides extrinsic information among the components of the log-likelihood ratio to the interleaver 34. When the number of iterations exceeds 1, the a priori information from the third constituent decoder 33 passed through the deinterleaver 37 is used when the first constituent decoder 31 computes a log-likelihood ratio.

The interleaver 34 receives the sequence $y_0$ and the extrinsic information from the first constituent decoder, and scrambles the order of them according to the rule as in the first interleaver 40 so as to provide the outputs to the second constituent decoder 32.

The second constituent decoder 32 receives the interleaved sequence of $y_0$ passed through the interleaver 34, the sequence $y_2$ and the extrinsic information that has been generated from the first constituent decoder 31 and passed through the interleaver 34 as a priori information. The second constituent decoder 32 then computes and provides a log-likelihood ratio and extrinsic information to the deinterleaver 35.

The deinterleaver 35 receives data outputs from the second constituent decoder 32 and recovers the original order of sequences from the scrambled order by the interleaver 34 so as to provide extrinsic information to the interleaver 36 and a log-likelihood ratio to the combiner 30 respectively.

The interleaver 36 receives the sequence $y_0$ and the extrinsic information from the second constituent decoder 32 passed through the deinterleaver 35, and scrambles the order of them according to the rule as in the second interleaver 41 so as to provide the outputs to the third constituent decoder 33.

The third constituent decoder 33 receives the interleaved sequence of $y_0$ passed through the interleaver 36, the sequence $y_3$ and the extrinsic information that has been generated from the second constituent decoder 32 and passed through the deinterleaver 35 and the interleaver 36. The third constituent decoder 33 then computes and provides a log-likelihood ratio and extrinsic information to the deinterleaver 37.

The deinterleaver 37 receives data outputs from the third constituent decoder 33 and recovers the original order of sequences from the scrambled order by the interleaver 36 so as to provide extrinsic information to the first constituent decoder 31 and a log-likelihood ratio to the combiner 30 respectively.

A decoding process starting from the fourth constituent decoder 31A in the second decoding block is as follows. Primarily, when initially starting the decoding process, the fourth constituent decoder 31A receives the sequences $y_0$ and $y_1$, computes and provides a log-likelihood ratio to the combiner 30, and provides extrinsic information among the components of the log-likelihood ratio to the interleaver 36A. When the number of iterations exceeds 1, the a priori information from the fifth constituent decoder 32A passed through the deinterleaver 35A is used when the first constituent decoder computes a log-likelihood ratio.

The interleaver 36A receives the sequence $y_0$ and the extrinsic information from the fourth constituent decoder 31A, and scrambles the order of them according to the rule as in the second interleaver 41 so as to provide the outputs to the sixth constituent decoder 33A.

The sixth constituent decoder 33A receives the interleaved sequence of $y_0$ passed through the interleaver 36A, the sequence $y_3$ and the extrinsic information that has been generated from the fourth constituent decoder 31A and passed trough the interleaver 36A as a priori information. The sixth constituent decoder 33A then computes and provides a log-likelihood ratio and ethnic information to the deinterleaver 37A.

The deinterleaver 37A receives data outputs from the sixth constituent decoder 33A and recovers the original order of sequences from the scrambled order by the interleaver 36A so as to provide extrinsic information to the interleaver 34A and a log-likelihood ratio to the combiner 30 respectively.

The interleaver 34A receives the sequence $y_0$ and the ethnic information from the sixth constituent decoder 33A passed through the deinterleaver 37A, and scrambles the order of them according to the rule as in the first interleaver 40 so as to provide the outputs to the fifth constituent decoder 32A.

The fifth constituent decoder 32A receives the interleaved sequence of $y_0$ passed through the interleaver 34A, the sequence $y_2$ and the extrinsic information that has been generated from the sixth constituent decoder 33A and passed through the deinterleaver 37A and the interleaver 34A. The fifth constituent decoder 32A then computes and provides a log-likelihood ratio and extrinsic information to the deinterleaver 35A.

The deinterleaver 35A receives data outputs from the fifth constituent decoder 32A and recovers the original order of sequences from the scrambled order by the interleaver 34A so as to provide extrinsic information to the fourth constituent decoder 31A and a log-likelihood ratio to the combiner 30 respectively.

Maximum 6 decoding processes can occur in parallel operation of the two decoding blocks 38 and 39 as follows: the first decoding process performed in the first decoding block, which starts from the first constituent decoder 31, passes through the second constituent decoder 32 and completes one iteration at the third constituent decoder 33; the second decoding process that starts from the second constituent decoder 32, passes through the third constituent decoder 33 and completes one iteration at the first constituent decoder 31; the third decoding process that starts from the third constituent decoder 33, passes through the first constituent decoder 31 and completes one iteration at the second constituent decoder 32; the fourth decoding process performed in the second decoding block coupled to the first decoding block in parallel and having the same structure as the first decoding block, which starts from the fourth constituent decoder 31A, passes through the sixth constituent decoder 33A and completing one iteration at the fifth constituent decoder 32A; the fifth decoding process that starts from the sixth constituent decoder 33A, passes through the fifth constituent decoder 32A and completes one iteration at the fourth constituent decoder 31A; and the sixth decoding process that starts from the fifth constituent decoder 32A, passes through the fourth constituent decoder 31A and completes one iteration at the sixth constituent decoder 33A.

Finally, the combiner 30 combines six log-likelihood ratios derived through the six decoding processes at a certain decoding time to obtain diversity gain, thereby reducing the bit error rate and decreasing the required number of iterations to satisfy a given bit error rate.

A method of weighting the respective components of each log-likelihood ratio is the same as the case illustrated in FIG. 2, so the description on the method in this embodiment B is omitted.

Compared with the conventional decoding method and the decoding method A of the present invention, the decoding method B of the present invention has a disadvantage of increasing complexity of the system due to the use of additional decoding blocks while it has an advantage of decreasing the bit error rate.

When a code rate is 1/n, according to the conventional decoding method, the required number of constituent decoders is n−1 and the number of log-likelihood ratios obtained at a certain decoding time is 1. On the other hand, according to the decoding method A of the present invention, the required number of constituent decoders is n−1 and the number of log-likelihood ratios obtained at a certain decoding time is also n−1. According to the decoding method B of the present invention, the required number of constituent decoders is (n−1)! and the number of log-likelihood ratios obtained at a certain decoding time is also (n−1)!.

Consequently, it can be anticipated that the diversity gain according to the decoding methods A and B of the present invention gets larger as the code rate gets lower. As shown in the following tables 1 and 2 obtained through simulation, the coding gain of the decoding method of the present invention over the conventional decoding method at the bit error rate $10^{-5}$ gets larger as the code rate gets lower. This is because diversity effects obtained according to the decoding methods of the present invention increase as the code rate gets lower.

The table 1 shows coding gains obtained according to the decoding method A of the present invention against the conventional decoding method when the code rate r is 1/3 and the size of the interleaver N is 256. The table 2 shows coding gains obtained according to the decoding methods A and B of the present invention against the conventional decoding method when the code rate r is 1/4 and the size of the interleaver N is 256.

TABLE 1

| | Decoding method A of the present invention | |
|---|---|---|
| | $(\omega_a, \omega_b) = (1, 1)$ | $(\omega_a, \omega_b)_{opt}$ |
| p = 1/2 | 1.54 Db | 1.89 dB |
| p = 1 | 0.62 dB | 0.82 dB |
| p = 1 & 1/2 | 0.36 dB | 0.45 dB |
| p = 2 | 0.17 dB | 0.24 dB |
| p = 2 & 1/2 | 0.13 dB | 0.16 dB |
| p = 3 | 0.10 dB | 0.13 dB |

TABLE 2

| | Decoding method A of the present invention | | Decoding method B of the present invention | |
|---|---|---|---|---|
| | $(\omega_a, \omega_b) = (1,1)$ | $(\omega_a, \omega_b)_{opt}$ | $(\omega_a, \omega_b) = (1, 1)$ | $(\omega_a, \omega_b)_{opt}$ |
| p = 1/3 | 2.06 dB | 2.89 dB | 2.06 dB | 2.89 dB |
| p = 2/3 | 1.26 dB | 1.53 dB | 1.38 dB | 1.83 dB |
| p = 1 | 0.93 dB | 1.10 dB | 1.13 dB | 1.36 dB |
| p = 2 | 0.40 dB | 0.45 dB | 0.58(113 | 0.67 dB |

Figure 4:
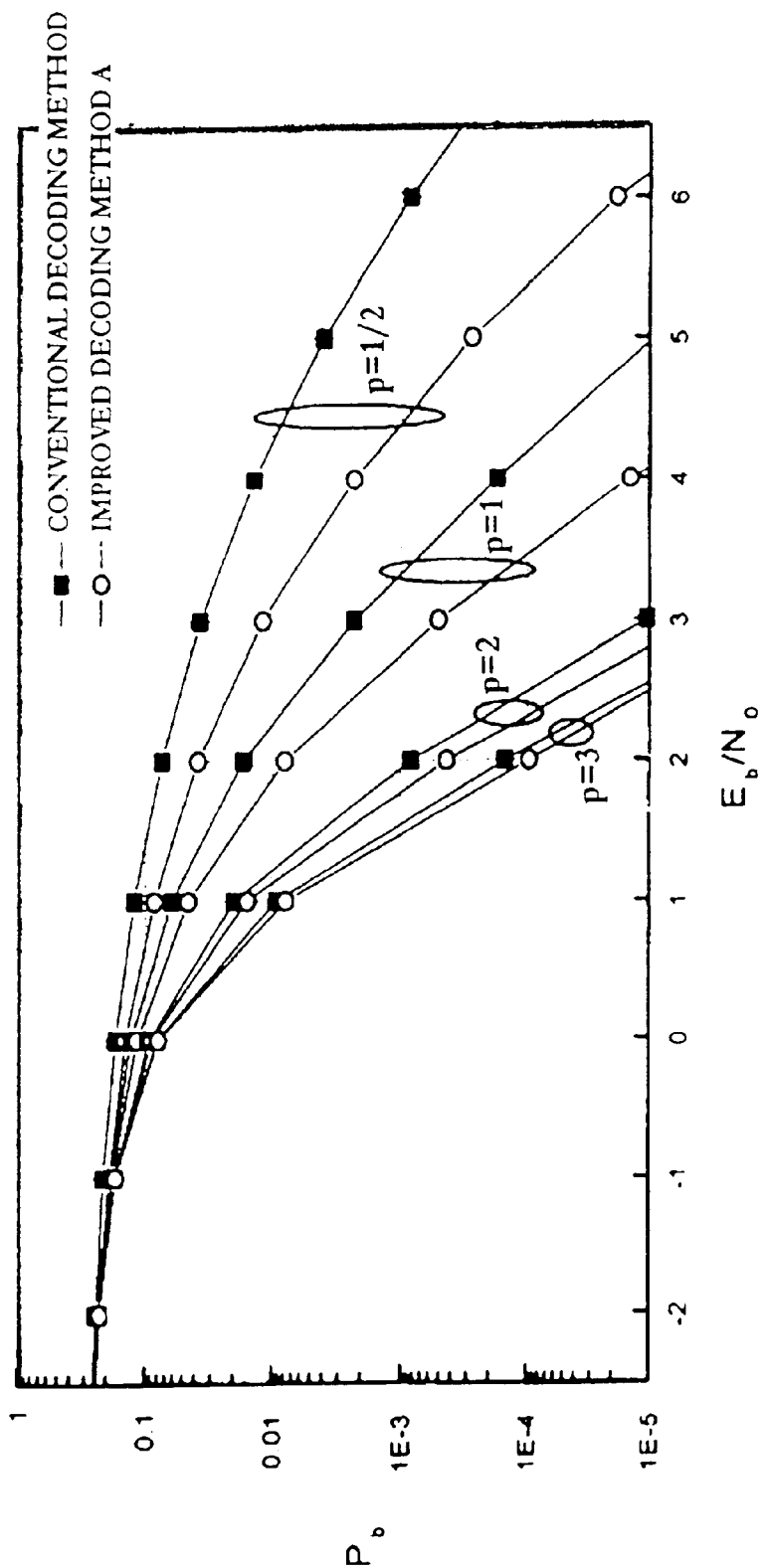
FIG. 4 is a graph showing the simulation results of the bit error rates for code rate 1/3.
Figure 5:
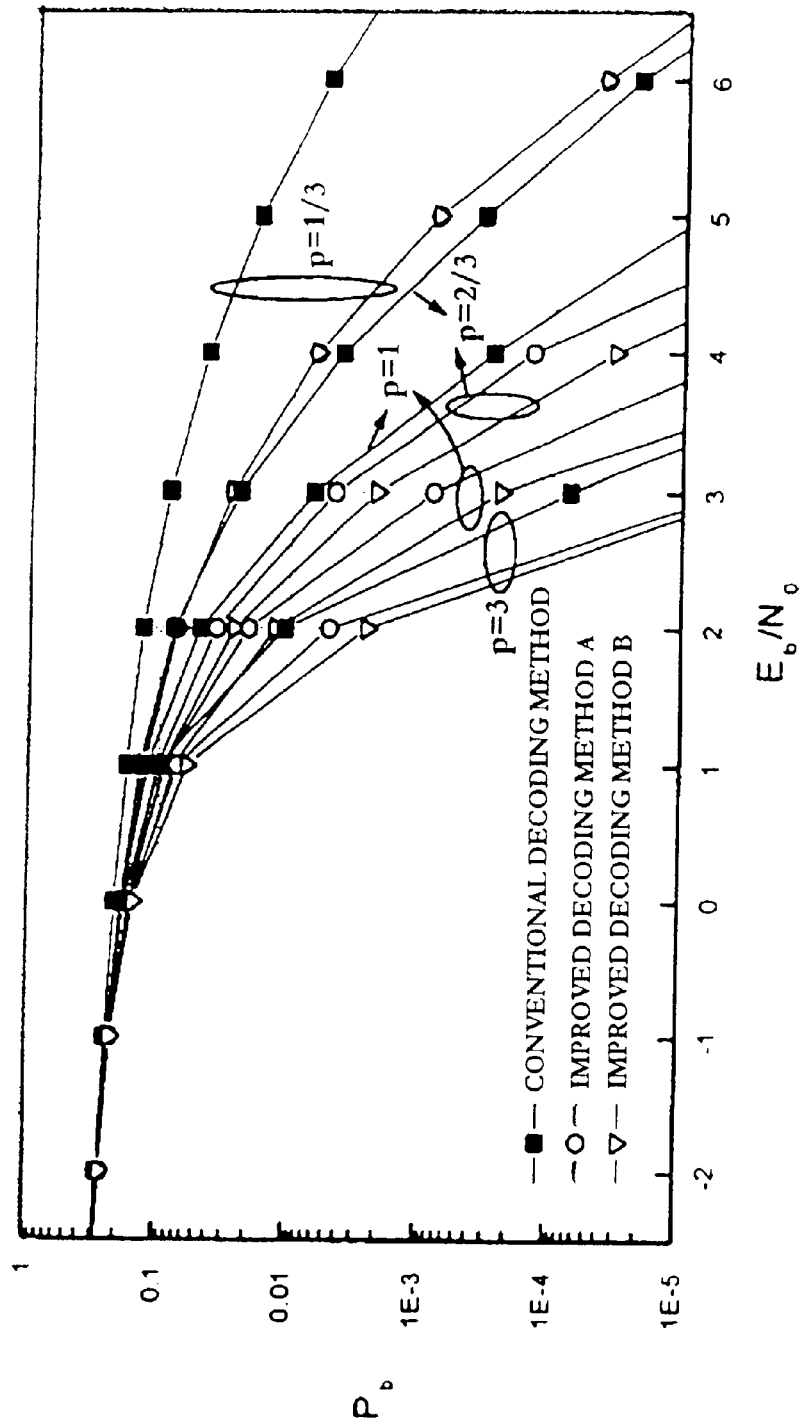
FIG. 5 is a graph showing the simulation results of the bit error rates for code rate 1/4.

FIGS. 4 and 5 are graphs respectively showing the simulation results of bit error rates for code rate 1/3 and 1/4. According to the graphs, it is proved that the bit error rate gradually gets lower in order of the conventional decoding method, the decoding method A of the present invention, and the decoding method B of the present invention. It is also proved that effect of the improvement of the bit error rate according to the present invention gets greater as the number of iterations, p gets less. The number of iterations is actually limited by time delay.

As illustrated above, the decoding method according to the present invention activates constituent decoders in parallel, puts optimum weights on the components of each log-likelihood ratio from each decoding process and combines them, thereby considerably improving a bit error rate characteristic. Therefore, the present invention reduces decoding time and transmit power required to satisfy a given bit error rate in a mobile communication, satellite communication, and data communication, etc.

It will be apparent to those skilled in the art that various modifications and variations can be made in a decoding method of turbo codes and a device for the same of the present invention without deviating from the spirit or scope of the invention. Thus, it is intended that the present invention covers the modifications and variations of this invention provided they come within the scope of the appended claims and their equivalents.

What is claimed is:

1. In a method of decoding turbo codes at a decoding block including n−1 constituent decoders, n−2 or more interleavers, and n−2 or more deinterleavers, said decoding block having a code rate 1/n, a decoding method of turbo codes using a weighted parallel type comprising:

a first decoding process of sequentially decoding starting from a first constituent decoder among said n−1 constituent decoders to generate a first log-likelihood ratio after completing the decoding;

a second decoding process of sequentially decoding starting from a second constituent decoder to generate a second log-likelihood ratio after completing the decoding, said second decoding being activated in parallel with said first decoding;

a (n−1)th decoding process of, after said decodings are continually performed in parallel, sequentially decoding starting from a (n−1)th constituent decoder to generate a (n−1)th log-likelihood ratio after completing another decoding different from said decodings, said (n−1)th decoding being activated in parallel with said decodings;

a step of optimally weighting respective components forming each log-likelihood ratio generated by each constituent decoder; and a step of combining the weighted log-likelihood ratios simultaneously generated at respective decoding processes to obtain diversity gain.

2. The decoding method according to claim 1, wherein said decodings are activated in parallel at a code rate 1/n up to maximum n−1 decoding processes.

3. The decoding method according to claim 1, wherein said decodings simultaneously generate maximum n−1 log-likelihood ratios at a code rate 1/n.

4. The decoding method according to claim 1, wherein said decodings are performed in parallel with further equipment of maximum [(n−1)!/(n−1)]−1 decoding blocks activated in parallel with said decoding block.

5. The decoding method according to claim 4, wherein said decodings are activated in parallel at a code rate 1/n up to maximum (n−1)! decoding processes.

6. The decoding method according to claim 4, wherein said decodings simultaneously generate maximum (n−1)! log-likelihood ratios at a code rate 1/n.

7. The decoding method according to claim 4, wherein said weighting step comprises the step of determining optimal weights depending upon the number of iterations to minimize the bit error rate.

8. The decoding method according to claim 4, wherein said step of combining weighted log-likelihood ratios and performing the hard decision at said combiner is performed after a predetermined number of iterations.

9. The decoding method according to claim 1, wherein said weighting step comprises the step of determining optimal weights depending upon the number of iterations to minimize the bit error rate.

10. The decoding method according to claim 1, wherein said step of combining weighted log-likelihood ratios and performing the hard decision at said combiner is performed after a predetermined number of iterations.

11. In a device for decoding turbo codes at a decoding block including n−1 constituent decoders, n−2 or more interleavers, and n−2 or more deinterleavers, said decoding block having a code rate 1/n, a turbo code decoding device using a parallel type comprising:

n−1 constituent decoders, each for receiving parts of sequences received from a transmitting party and extrinsic information from a related constituent decoder as a priori information and for providing a log-likelihood ratio and extrinsic information;

n−2 or more interleavers, each coupled to a front of each constituent decoder, for receiving parts of the sequences received from the transmitting party and extrinsic information from a related constituent decoder and for scrambling the order of them according to a particular rule to provide outputs;

n−2 or more deinterleavers, each coupled to a back of each constituent decoder, for receiving the log-likelihood ratio and extrinsic information and recovering the original order of sequences to provide outputs; and a combiner for combining the optimally weighted log-likelihood ratios after a predetermined number of iterations and performing the hard decision.

12. The turbo decoding device according to claim 11, further comprising maximum [(n−1)!/(n−1)]−1 decoding blocks coupled to said decoding block in parallel and activated in parallel.

* * * * *